United States Patent [19]

Bachman et al.

[11] Patent Number: 4,946,549

[45] Date of Patent: Aug. 7, 1990

[54] METHOD FOR FABRICATING OR MODIFYING AN ARTICLE COMPRISING THE REMOVAL OF A POLYMER COATING

[75] Inventors: Bonnie J. Bachman, Chester; Elizabeth A. Hofstatter, East Hanover; Joan M. Ritter, Fanwood; Jerry J. Rubin, Warren, all of N.J.

[73] Assignee: AT&T Bell Laboratories, Murray Hill, N.J.

[21] Appl. No.: 428,137

[22] Filed: Oct. 27, 1989

[51] Int. Cl.[5] ...................... B44C 1/22; C03C 15/00; C03C 25/06; B29C 37/00

[52] U.S. Cl. .................................. 156/643; 156/646; 156/655; 156/659.1; 156/668; 156/345; 204/192.36; 252/79.1

[58] Field of Search ............ 156/643, 646, 655, 659.1, 156/668, 345; 204/192.32, 192.35, 192.36; 427/38, 39; 252/79.1

[56] References Cited

U.S. PATENT DOCUMENTS

| | | | |
|---|---|---|---|
| 4,123,308 | 10/1978 | Nowlin et al. | 156/272 |
| 4,138,306 | 2/1979 | Niwa | 156/345 |
| 4,175,235 | 11/1979 | Niwa et al. | 250/542 |
| 4,673,456 | 6/1987 | Spencer et al. | 156/345 |
| 4,734,300 | 3/1988 | Simanyi et al. | 427/444 |
| 4,776,923 | 10/1988 | Spencer et al. | 156/643 |

OTHER PUBLICATIONS

"Parylene Conformal Coatings For Printed Circuit Board Applications", *Proceedings of the 17th Electrical/Electronics Insulation Conference,* Sep-Oct. 1985, pp. 288-290, Roger Olson.

"Critical Review, Oxygen plasma etching for resist stripping and multilayer lithography", J. Vac. Sci. technol. B, vol. 7, No. 1, 1989, pp. 1-13, M. A. Hartney et al.

"XPS Analysis of $O_2$—$CF_4$ and $O_2$—$SF_6$ Plasma Etched Polyimide Surfaces", *Proceedings of the Fifth Symposium On Plasma Processing,* vol. 85-1 of the Electrochemical Society, pp. 193-205, 1985, F. Emmi et al.

"A. Study of the Mechanism of Polyimide Etching In a Microwave Plasma Downstream Etcher", *Proceedings of the Fifth Symposium on Plasma Processing,* vol. 85-1 of the Electrochemical Society, 1985, pp. 206-215, B. Robinson et al.

"Polyimide Etching In $O_2$/$CF_4$RF Plasmas", *Proceedings of the Fifth Symposium on Plasma Processing,* vol. 85-1 of the Electrochemical Society, 1985, pp. 216-226, T. Yogi et al.

"Microwave Plasma Photoresist Stripping", *Proceedings of the Fifth Symposium on Plasma Processing,* vol. 85-1 of the Electrochemical Society, 1985, pp. 227-234, B. Charlet et al.

"The Parylene-Aluminum Multilayer Interconnection System for Wafer Scale Integration and Wafer Scale Hybrid Packaging", *J. of Electronic Materials,* vol. 18, No. 2, 1989, pp. 301-311, N. Majid et al.

*Primary Examiner*—William A. Powell
*Attorney, Agent, or Firm*—David R. Cochran; Eugen E. Pacher

[57] ABSTRACT

Disclosed is a method for removing poly-para-xylylene, its derivatives, and copolymers (collectively called "parylene") from bodies, including relatively large bodies such as printed circuit (PC) boards, that is capable of yielding relatively high removal rates. A body such as a PC board coated with parylene is placed into a reaction chamber downstream from a microwave plasma such that plasma discharge products generated by the microwave plasma react with the parylene, etching the parylene without exposing the body to bombardment by energetic ions and/or electrons. The plasma is generated from a gas mixture containing oxygen, a second gas, and optional additives such as $N_2O$, He, or Ar. The second gas is selected from the group consisting of fluorocarbons, fluorosulfides, and chlorofluorocarbons. A currently preferred second gas is $CFR_4$. The inventive method is also applicable for fabricating articles such as integrated circuits and semiconductor devices that comprise a parylene layer.

19 Claims, 4 Drawing Sheets

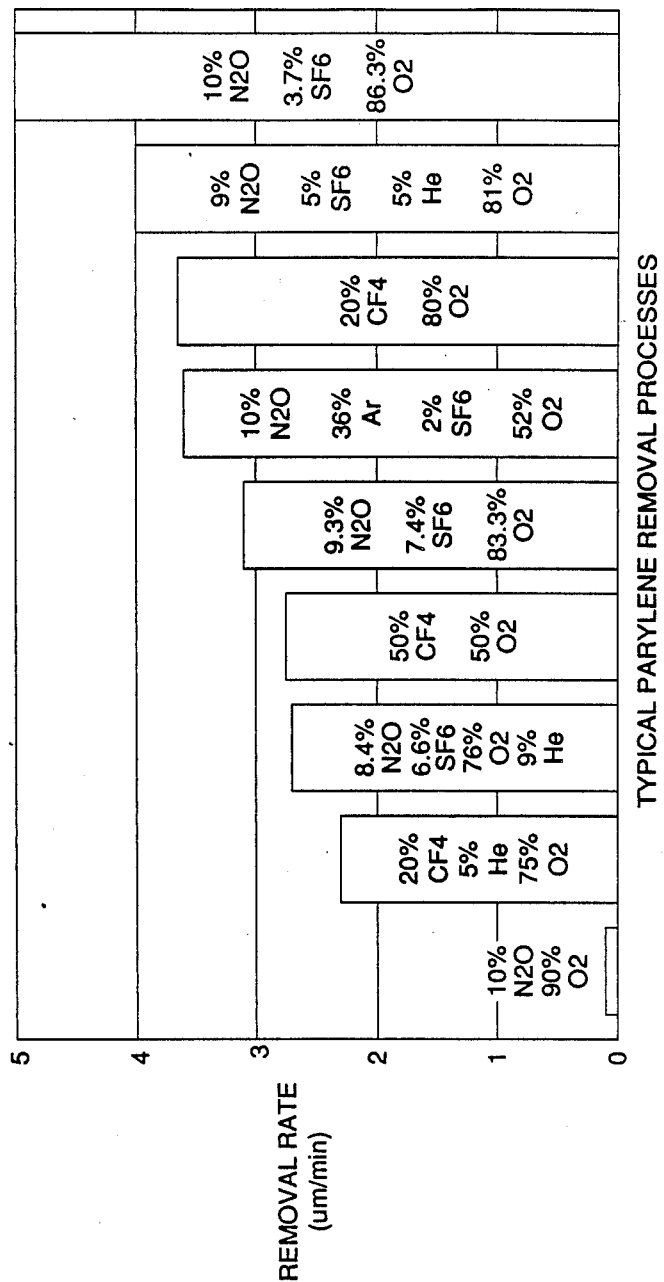

METHOD FOR FABRICATING OR MODIFYING AN ARTICLE COMPRISING THE REMOVAL OF A POLYMER COATING

TECHNICAL FIELD

The field of the invention relates to the removal of polymer coatings, exemplarily, poly-para-xylylene and its derivatives.

BACKGROUND OF THE INVENTION

It is a frequent practice in the semiconductor industry to apply a protective polymer coating over a finished or semi-finished product, e.g., completely configured printed circuit (PC) boards with integrated circuits (ICs) mounted thereon. A frequently used protective polymer is parylene, which provides a conformal coating that is easily applied. In many cases it is necessary to remove the coating at some later time, e.g., to make changes or repairs on the circuit board. Though its ease of application and its coverage capabilities make parylene a desirable coating material, it is extremely difficult to remove.

Parylene is a generic name for members of a series of polymerized paraxylylenes whose basic member is poly-para-xylylene, commonly known as parylene-N. The monomer of poly-para-xylylene consists of a benzene ring bonded to two methyl groups to create a linear molecule. A second member of the series is poly-monochloro-para-xylylene, known as parylene-C. Poly-monochloro-para-xylylene is a variation of poly-para-xylylene wherein the variation consists of a single chlorine atom substituting for one of the aromatic hydrogens in the benzene ring of the monomer molecule. A third member of the series is poly-dichloro-para-xylylene, commonly known as parylene-D. The member of the series known as parylene-E (poly-ethyl-para-xylylene) has an ethyl group in place of the chlorine in poly-monochloro-para-xylylene. More generally, parylene-E contains an alkyl group substituted for the ethyl group. Additionally, fluorinated parylenes are commonly referred to as parylene-F. Throughout this text, the term parylene will be used in a generic sense and will refer to poly-para-xylylene, its derivatives, and co-polymers.

Poly-para-xylylene and poly-monochloro-para-xylylene are generally deposited with substantially the same process. Exemplarily, either dimer is vaporized at approximately 250° C. The dimer is then pyrolized at about 680° C. into a monomer, which is allowed to diffuse at room temperature into a deposition chamber where it condenses and polymerizes on the surface of everything in the chamber in a conformal manner. The low temperature deposition and complete coverage properties of parylene make it very useful as a protective coating. Parylene as a protective coating for electronic printed circuit boards is especially advantageous. See, for instance, R. Olson, *Proceedings of the 17th Electrical/Electronics Insulation Conference*, pp. 288-290, 1985, and U.S. Pat. No. 4,123,308, both incorporated herein by reference.

Poly-monochloro-para-xylylene has a lower water absorption rate, lower coefficient of thermal expansion, and generally forms a more pinhole free film than poly-para-xylylene. In addition, the inclusion of one chlorine atom on each benzene ring of the polymer chain makes poly-monochloro-para-xylylene extremely resistant to solvents. Though this makes parylene-C a very good protective coating, it also makes the repair of assemblies and/or subassemblies difficult if the coating must be removed.

Parylene-E, on the other hand, can be dissolved, though with some difficulty, in some solvents such as xylene, toluene, hexane, methylene chloride, and chloroform. The mixing of parylene-E and parylene-C allows for the engineering of the solvent resistance of a coating while retaining some of the protective benefits of the moisture and insulation properties of parylene-C. Methods of coating removal, other than mixing with sufficient parylene-E to permit solvent removal, are available. These include abrasion, chemical-aided removal, and plasma etching in an oxygen barrel reactor; however, these methods have also not proved completely satisfactory.

Use of abrasion techniques runs the risk of damaging coated electronic and mechanical parts adjacent to the coating being removed, and of generating dirt and dust that may be difficult to remove. Chemical-aided parylene removal methods, such as those used in U.S. Pat. No. 4,734,300, still require physical means to remove a coating from an article, subjecting the article to possible damage from the physical means applied. The use of a chemical, for instance, tetrahydrofuran in the aforementioned patent, can result in the chemical attack of coatings and components adjacent to and under the coating being removed. Plasma etching in an oxygen barrel reactor typically is slow requiring long processing times. For instance, U.S. Pat. No. 4,123,308 discloses that parylene exposed to an oxygen plasma is typically etched at the rate of 1000 Å per minute. This rate, in many cases, is too low for removing parylene from PC boards in a manufacturing environment. In addition, ions in the plasma can cause damage to electronic components, exemplarily due to electrostatic discharge (ESD) that can result from bombardment by the energetic ions.

Plasma etchers have been developed that separate the plasma generating section from the reaction chamber in which the etching takes place. This allows for the generation of plasma discharge products, a gas of reactive atoms and molecules, without electrons and ions bombarding the body being etched. In addition, the reaction from the contact of the plasma discharge products with the body is downstream from the plasma source. Some configurations of this type of "downstream" plasma etcher have used microwave generators as the plasma source to more efficiently couple energy into the plasma. Such microwave plasma etchers are described, for example, in U.S. Pat. No. 4,673,456, U.S. Pat. No. 4,138,306, U.S. Pat. No. 4,175,235, and U.S. Pat. No. 4,776,923. U.S. Pat. No. 4,776,923 also describes a method in which ultraviolet radiation generated in the plasma generating section is prevented from impinging on the body by the use of a bent path connecting the plasma generating section with the reaction chamber. Plasma etchers, including the types described in the aforementioned patents, have been used for the removal of $SiO_2$, $Si_3N_4$, photoresists, and polyimide from silicon wafers using a variety of gases such as $O_2$, $H_2$, $N_2O$, $CF_4$, $NF_3$, and $SF_6$ and mixtures thereof.

Studies have shown that the etch rate for polyimide and photoresists from silicon wafers is increased by addition of $N_2O$, $CF_4$, or $SF_6$ to an oxygen gas flow in a plasma etcher. As the percentage of oxygen in the flow is decreased (percentage of the additive is increased), the etch rate typically increases to a maximum. Beyond the maximum etch rate, further decreasing the percentage of oxygen in the gas flow typically results in a rapidly decreasing etch rate. As pointed out by M. A. Hartney et al., *Journal of Vacuum Science and Technology*, B, Vol. 7, No. 1, pp. 1–13, 1989, in a $CF_4/O_2$ gas flow the maximum etch rate for photoresists and polyimides usually occurs in the range of 20% to 30% $CF_4$, with a sharp peak about this maximum. Similarly, etching polyimides in a $SF_6/O_2$ gas flow exhibits a sharp maximum etch rate at about 5% $SF_6$ (see, for instance, Emmi, F. et al., *Proceedings of the Fifth Symposium on Plasma Processing*, Vol. 85-1 of the Electrochemical Society, pp. 193–205, 1985). The percentage of the $CF_4$ or the $SF_6$ associated with the maximum in the polyimide etch rates has been determined to be, among other factors, a function of substrate temperature, gas flow rate, and generator power (applicable to either RF or microwave generators). Studies of the etching of polyimides and photoresists can be found in a series of articles in the *Proceedings of the Fifth Symposium on Plasma Processing* Vol. 85-1 of the Electrochemical Society, 1985 (for instance, Emmi, F. et al., pp. 193–205, Robinson, B. et al., pp. 206–215, Yogi, T. et al., pp. 216–226, and Charlet, B. et al., pp. 227–234).

Parylene is a unique material, being one of the few polymers capable of forming a conformal coating that is truly solvent resistant. In addition, unlike polyimide, parylene is a semi-crystalline material (i.e. it has a well defined melting temperature). As previously mentioned, several techniques have been applied to remove parylene coatings, but none has proven totally satisfactory.

In view of the desirability of parylene as a coating material, a method for quickly removing parylene from a body or selected areas of a body, while causing substantially no damage to the body or subassemblies of the body, would be of great significance. This application discloses such a method.

SUMMARY OF THE INVENTION

The inventive method involves fabricating or modifying (including repairing) an article comprising a body that comprises, at least some time during the fabrication or modification, a polymer layer. The fabrication or modification includes removing at least a portion of the polymer layer by a plasma etching process. The polymer is a member of the group consisting of poly-para-xylylene, its derivatives, and copolymers (collectively "parylene").

A gas mixture containing oxygen, a second gas, and one or more optional additives is directed into a plasma chamber. The second gas is selected from the group consisting of the fluorocarbons of general formula $C_xF_y$, with x and y being integers, $1 \leq x \leq 4$ and $1 \leq y \leq 12$; fluorosulfides of general formula $S_rF_t$, with r and t being integers, $1 \leq r \leq 3$ and $1 \leq t \leq 16$; and chlorofluorocarbons of general formula $C_uF_vCl_w$, with u, v, and w being integers, $1 \leq u \leq 2$, $1 \leq v \leq 2$, and $1 \leq w \leq 2$. The additives are chosen from a group consisting of $N_2O$, He, Ne, Ar, Kr, and Xe. The optional additives comprise by volume at most 60% of the total gas mixture. The percentages of oxygen and the second gases generally depend on the combination of gases being used in the gas mixture. Typically, the percentages of the gases generally fall into the following ranges: oxygen between 30% and 90%, total fluorocarbon content between 10% and 70%, total fluorosulfide content between 1% and 10%, and total chlorofluorocarbon content between 2% and 20%.

A plasma is generated in the plasma chamber by microwave means, whereby plasma discharge products are produced. Some of the plasma discharge products enter a reaction chamber that holds the body and is downstream from the plasma chamber, connected to the plasma chamber by tubular means. The plasma discharge products react with at least a portion of the polymer of the body, resulting in an exhaust gas comprising reaction by-products and unreacted plasma discharge products. In an exemplary embodiment of the inventive method, the exhaust gas is caused to exit the reaction chamber through an exit located adjacent to the back of the body. After removing at least a portion of the polymer, the fabrication or modification of the article is completed.

Significantly, the inventive process makes possible parylene removal at a relatively high rate, and with substantially no damage to adjacent components or materials. It is also significant that the process permits relatively rapid removal of a parylene coating from relatively large bodies, for example, from bodies that are the size of printed circuit boards.

BRIEF DESCRIPTION OF THE DRAWINGS

FIG. 2 shows exemplary data on the removal rate of poly-monochloro-para-xylylene from silicon wafers for various gas mixtures;

DETAILED DESCRIPTION

The inventive method can, inter alia, be applied to the repair of printed circuit boards that are, exemplarily, subassemblies of an electronic or telecommunications system, since the method is applicable to removing, selectively if desired, parylene coatings from large area component substrates such as PC boards. Repair of PC boards includes repair, replacement, and addition of components. Although repair of PC boards is a currently preferred use of the inventive method, the method is not so limited. For instance, the method can also be used advantageously in semiconductor device manufacture, if parylene is used to form dielectric and/or passivation regions of an IC.

In the context of this and the following discussions, "body" refers to a member that comprises, at least at some stage during the process of fabricating or modifying the article, a parylene layer. The term encompasses such members as semiconductor substrates, electronic devices, PC boards configured or partially configured with components, and other mounting and housing units for electronic and telecommunications devices, subassemblies, and systems. In a preferred embodiment, "body" refers to a PC board at least partially configured. In another embodiment, "body" refers to a member containing layers of different materials which are being processed to form a semiconductor device such as an integrated circuit.

Figure 1:
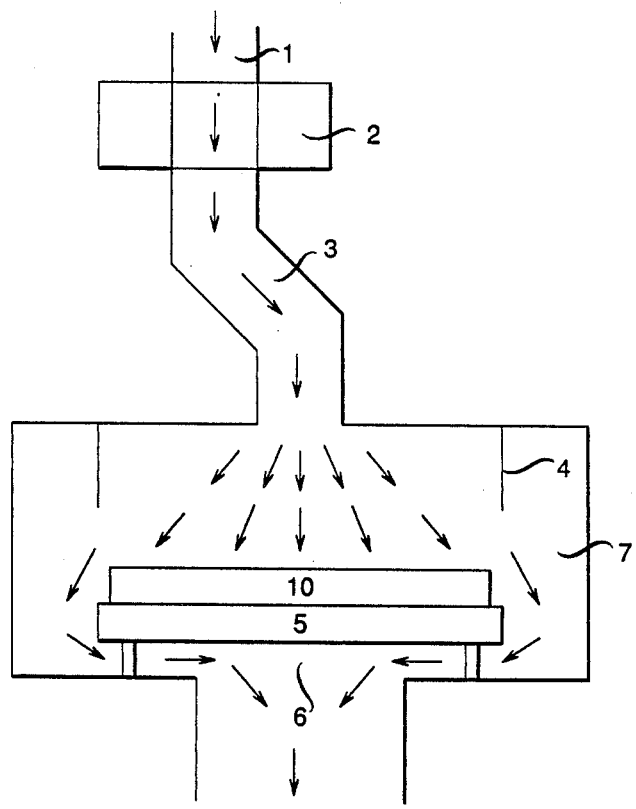
FIG. 1 schematically depicts an exemplary plasma etching system for practicing the inventive method.

FIG. 1 schematically depicts an exemplary plasma etching system for practicing the inventive method. Inlet 1 is the entrance for a mixture of gases to the plasma chamber 2 where plasma discharge products are produced from interaction of electromagnetic energy with the gases. The electromagnetic energy is supplied by a microwave source (not shown). Tubular means 3 connect the plasma chamber with a reaction chamber 7. The body 10 being etched is situated on a heating platform 5 in the reaction chamber such that at least a portion of the body is contacted by plasma discharge products flowing from the plasma chamber. The system is provided with an exit 6 connected to a vacuum pump (not shown) to remove the exhaust gas formed from the reaction of the plasma discharge products with the body.

In a preferred embodiment, the gas flow introduced to the system at 1 consists of a $CF_4/O_2$ mixture. Typically, commercially available $CF_4$ is mixed with oxygen, commonly (depending on the company suppling the mixture) with approximately 8.5% oxygen by volume. The $CF_4$ gas of FIG. 2 is $CF_4:O_2$ with about 8.5% oxygen but is labeled $CF_4$ for brevity. In the preferred embodiment, the $CF_4$ content (containing about 8.5% $O_2$) is in the range 20–50% of the total flow.

The gas mixture flows into a plasma chamber 2 which contains a microwave cavity area where a plasma is generated, with energy transferred to atoms and molecules of the gas mixture forming plasma discharge products. The efficiency of this energy transfer is a major aspect of the rapid removal rate of parylene obtainable by means of the inventive method. In an exemplarily preferred embodiment, the means for generating a plasma comprises a microwave source, with approximately 2.45 GHz power output frequency, having a full wave rectified power supply. Additionally, the power supply is a switching DC power supply with less than about 1% ripple in the power output, and having 0.1% feedback regulation or better of output power. It has been determined that etching rates are frequently substantially improved when using a full wave rectified power supply rather than a more conventional half wave rectified power supply. However, the inventive method does not require use of a full wave rectified power supply, but can be carried out with other known, stable sources of microwave power.

From the plasma chamber, some of the plasma discharge products flow toward a reaction chamber 7 which contains the body to be etched. Significantly, the plasma chamber and the reaction chamber are not co-located, but are connected by tubular means 3. This prevents the body from being exposed to energetic ions which are present in the plasma chamber and may cause damage to the body. In a preferred embodiment, the tubular means includes at least one bend such that there is no line of sight connection from the microwave plasma within the plasma chamber to the reaction chamber. Thus, ultraviolet radiation generated in the plasma is prevented from interacting with the body.

Plasma discharge products are directed towards the body, preferably, by a gas containment sleeve 4 located at the inlet to the reaction chamber. They react with the polymer, etching it. FIG. 2 shows exemplary etch rates for poly-monochloro-para-xylylene on silicon wafers for various gas mixtures. Significantly, the etch rates for parylene resulting from application of the inventive method are substantially greater than typical etch rates attained by prior art methods of plasma etching. Of course, for a given plasma etching system, the etch rate is generally dependent on the total surface area of the body being etched. $SF_6/O_2/N_2O$ typically produces a higher etch rate than $CF_4/O_2$, but $CF_4$ is more common, more stable, and easier to handle than $SF_6$, making, as previously mentioned, $CF_4/O_2$ a currently preferred gas mixture. As indicated in FIG. 2, the etch rates for $CF_4/O_2$ mixtures with 20% and 50% $CF_4$ in the total flow are not substantially different. In a $CF_4/O_2$ mixture, etch rates typically do not drop substantially until the percentage of $CF_4$ in the gas mixture significantly differs from the 20%–50% range, e.g., mixtures with 5% or 85% $CF_4$.

Other fluorocarbons, $C_xF_y$, or fluorosulfides, $S_r$, $F_t$, can be used in an oxygen mixture. Additionally, it is believed that chlorofluorocarbons, $C_uF_vCl_w$, which are used in semiconductor processing, can be used in combination with oxygen. Use of chlorofluorocarbons is especially advantageous when the article being fabricated is a semiconductor device, since it reduces the variety of gases used in the fabrication process. However, in all applications the second gas is selected from those stoichiometric compounds that are gaseous at room temperature.

Figure 3:
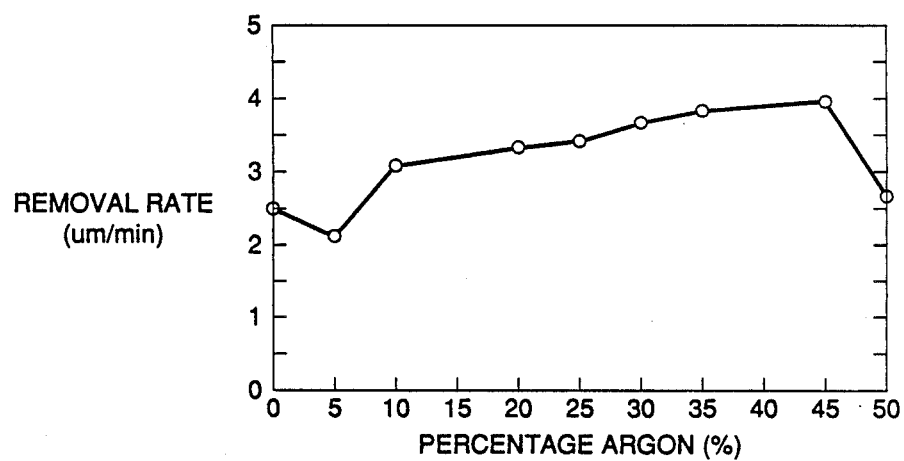
FIG. 3 shows exemplary data on the removal rate of poly-monochloro-para-xylylene from silicon wafers with increasing percentage of argon usage in a $SF_6/O_2/N_2O/Ar$ gas mixture.

For the most part, the optional additives included in the gas mixture are inert gases. These gases typically do not chemically react with the parylene, but are believed to assist in the transfer of energy to the reactive gases forming the plasma discharge products. FIG. 3 shows exemplary data on the removal rate of poly-monochloro-para-xylylene from silicon wafers with increasing percentage of argon usage in a $SF_6/O_2/N_2O/Ar$ gas mixture. In the gas mixtures represented by FIG. 3, the percentage of oxygen in the mixture decreases as the percentage of argon increases, maintaining the $SF_6$ and the $N_2O$ content of the total gas flow at approximately 4% and 10%, respectively. As indicated in FIG. 3, the addition of Ar to the process gas mixture, $SF_6/O_2/N_2O$, results in an increased etching rate until the volume of Ar in the total gas flow reaches about 45%. Beyond about 50% Ar content in the gas flow (about 60% total additives in the gas mixture), the etching rate is projected to decrease at a significant rate.

$N_2O$ also can be an additive to the gas flow since it supplies oxygen for the oxidative reaction on the body surface. In a further currently preferred embodiment, a $CF_4/O_2$ gas mixture is used in the etching process until the removal of the parylene is nearly complete. Then the $CF_4/O_2$ mixture is replaced by a $N_2O/O_2$ gas mixture. Use of the $N_2O/O_2$ gas mixture at the end of the etching process essentially cleans the parylene surface, removing residual fluorine that may adhere to the body surface.

Figure 5:
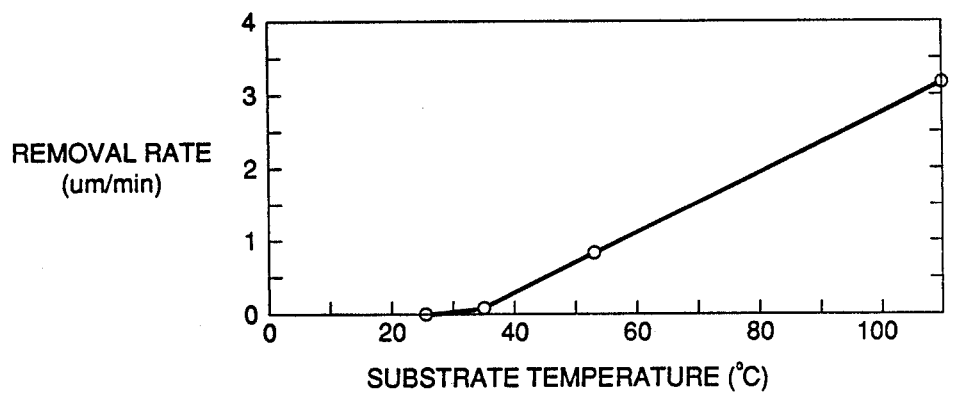
FIG. 5 illustrates the temperature dependence of the removal rate of poly-monochloro-para-xylylene from silicon wafers.

Typically, the etch rate of parylene also can be significantly enhanced by increasing the body temperature. FIG. 5 shows the removal rate of poly-monochloro-para-xylylene from silicon wafers as a function of wafer temperature, using a $N_2O/SF_6/O_2$ gas mixture with approximate volume content 10%/7.5%/82.5%, respectively. In many cases it has been found advantageous to maintain the body at a relatively high temperature, whereby a relatively high removal rate can be obtained. Those skilled in the art will appreciate that considerations other than parylene removal rate (e.g. the presence of low melting point material) may limit the maximum acceptable temperature of the body. However, practice of the inventive method at room temperature also results typically in substantial etch rates. The inventive method can be advantageously practiced by mounting the body in the reaction chamber on a heated platform 5 (see FIG. 1) to control the body temperature. For embodiments in which a body, such as a PC board, has low thermal conductivity, the body can be heated by other means such as heating lamps.

Figure 4:
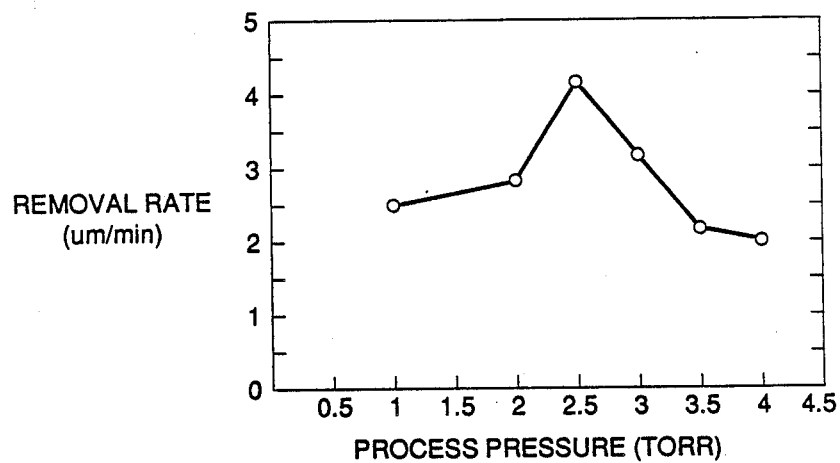
FIG. 4 presents exemplary data on the removal rate of poly-monochloro-para-xylylene from silicon wafers as a function of the pressure.

Process pressure is also a factor in the etch rate of parylenes. FIG. 4 shows the etch rate of parylene-C from silicon wafers as a function of pressure in the reaction chamber, using a $N_2O/SF_6/O_2$ gas mixture with approximate volume content 10%/7.5%/82.5%, respectively. Typically, the pressure is measured near the reaction chamber exit, but just outside the reaction chamber. Above 4 torr the etch rate will continue to decrease below its maximum rate at pressure of about 2.5 torr. Typically, the efficiency of coupling energy into the gas mixture to form the reactive gases of the plasma discharge products decreases at higher pressures. In addition, the interaction of the reactive gases results in a neutralization process decreasing the amount of reactive species available for contact with the body. At higher pressures, the etch rate is significantly lower. In some embodiments, the inventive method can be advantageously practiced at higher pressures such as to remove the parylene at a relatively slow rate. For example, for etching parylene in IC fabrication, a relatively slow etch rate is desired to insure that the body is not overetched. For most embodiments, it is believed that pressures above about 100 torr will not produce useful etch rates. Thus, the inventive method is best practiced with the process pressure below 100 torr, preferably in the range 0.5–10 torr, exemplarily at about 2.5 torr, to attain high etch rates. Of course, there needs to be sufficient elemental and molecular species to react with the parylene. Below a pressure of about 0.05 torr, the concentrations of reactive gases are generally too low to produce useful etch rates.

Etching of the parylene results in reaction by-products that are exhausted from the reaction chamber along with unreacted plasma discharge products. In a preferred embodiment, the exhaust exit 6 (see FIG. 1) to a vacuum system is located directly in back of the body, the plasma discharge products contacting and etching the front of the body. With the exit so situated, the plasma discharge products are made to flow relatively uniformly over the entire body front surface. In addition, in this arrangement the exhaust gas is directed away from the front surface of body, reducing the possibility of depositing elements of the exhaust gas back on the front surface. However, to remove parylene from both sides of the body, the body can be suspended such that the plasma discharge products contact both the front and back of the body in approximately equal proportions. In this configuration, reactions at the front and back of the body generally contribute substantially equally to the formation of the exhaust gas.

Exemplarily, after removing parylene from a PC board, the board is further modified by such procedures as removing or repairing a defective component, replacing a defective component with a functioning component or adding new components which will incorporate additional features into the system comprising the PC board, re-coating at least a portion of the board with parylene, testing the electronic components on the PC board, and, possibly, again applying the modification process of the inventive method if testing indicates that the repaired or added components are not functioning satisfactorily.

Figure 6:
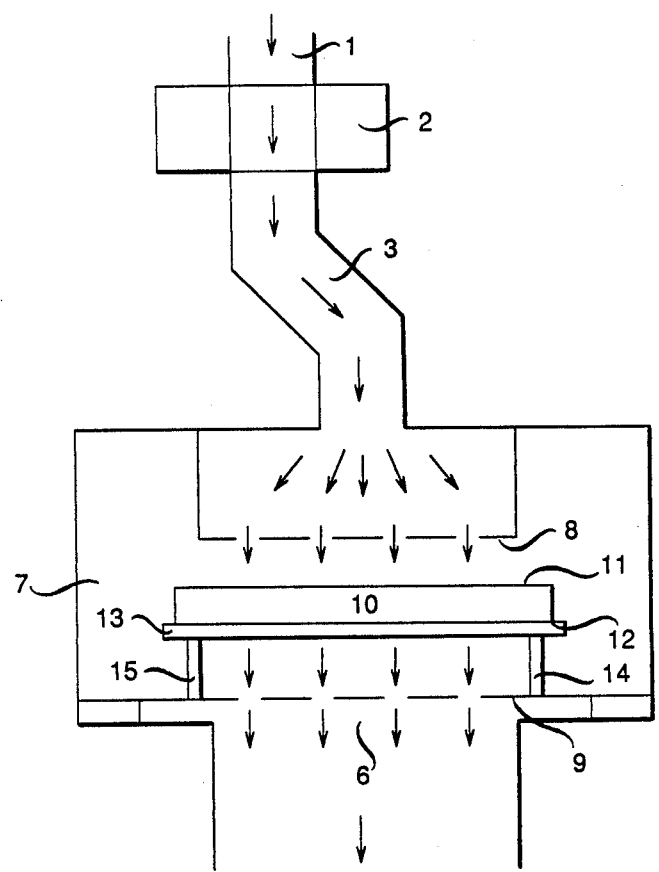
FIG. 6 schematically depicts an exemplary plasma etching system adapted for selectively etching a body according to the inventive method.

FIG. 6 schematically depicts an exemplary etching system adapted for selectively etching a body in accordance with the inventive method. Plasma discharge products entering the reaction chamber are directed through a baffle box 8 to the body 10, which is mounted on a platform 13 resting on pins 14 and 15. The baffle box, which replaces the internal containment sleeve 4 (see FIG. 1), is a topless box-like structure with side walls which can be mounted to the top of the reaction chamber. The inlet to the reaction chamber is within the area defined by the baffle box walls and the top of the reaction chamber. The bottom of the baffle box consists of slides with variable size outlet holes. The location of the holes are patterned to correspond to the areas of the body to be etched. Virtually any pattern of holes can be made, including a pattern for etching an entire surface of a parylene-covered body. The baffle box is situated directly above the front 11 of the body such that the plasma discharge products pass through the holes in the baffle box and contact the body substantially only at the selected locations of the body. Optionally, to aid in the selective etching of the body, a "floor" 9 patterned with holes corresponding to the pattern of holes in the baffle box, is placed directly behind the back 12 of the body adjacent to the reaction chamber exit. With the exit to the evacuation system and with the path to the body so designed, the flow of plasma discharge products is restricted to flow across the body at the selected locations. The correspondence between the pattern of holes in the baffle box and the pattern of holes in the floor need not be a one-to-one correspondence, but can be any correspondence that produces a desired flow pattern in the reaction chamber.

Preferably, the bottom of the baffle box is made of quartz, and advantageously provides a conductive path (resulting from contact of the plasma discharge products with the walls forming the holes in the baffle box bottom) for removing heat from the plasma discharge products. However, quartz is susceptible to slow etching by the plasma discharge products. Coating the quartz baffle box (at least the bottom of the baffle box where the plasma discharge products flow through small holes) with a layer of tetrafluoroethylene (TFE) fluorocarbon polymers, fluorinated ethylene-propylene (FEP) resins, or copolymers of TFE and FEP will protect it, since these materials are substantially non-reactive with the plasma discharge products.

Essentially, the baffle box is a masking means. Other masking means can be used to selectively etch a portion of parylene from a body. This is especially advantageous in an embodiment wherein a semiconductor electronic device, such as an IC, is being fabricated, in accordance with the inventive method, with parylene being used in dielectric and passivation regions of the device. In correspondence with typical semiconductor processing that uses conventional polymers such as polyimide, parylene is formed as a layer over relatively large areas of the electronic chip. Subsequently, selective portions of the parylene layer are removed, e.g. to make possible the introduction of dopant materials to form electrically active regions. In addition, portions of parylene typically are removed to form vias and other electrically conducting paths through the parylene layers in the device. After removal of the parylene and subsequent deposit of metallization for the vias and conducting paths, if necessary, parylene is again deposited and the process is repeated to form additional device layers. A final layer of parylene may be deposited to form a passivation layer to protect the semiconductor device prior to undergoing packaging processes.

EXAMPLE 1

A layer of parylene, approximately 1 mil (25.4μ) thick, was removed from a 6 in. ×3 in. PC board configured with ICs using a downstream microwave plasma etching system. In the system, process gases are individually routed to a blend manifold where the gases are mixed. The manifold is connected to an essentially straight 1 in. diameter quartz tube by way of a ¼ in. stainless steel tubing which is coupled to a ½ in. diameter neck for delivery of the gas mixture to the quartz tube. The quartz tube is connected to a 3 in. long, 1 in. diameter cylindrical microwave cavity where a microwave plasma is generated. Microwave power is supplied to the cavity using an ASTeX S-1000 microwave power source and ASTeX waveguide components. The S-1000 provides up to 1 kW CW of 2.45 GHz microwave power, regulated to 0.5% of output power with less than 1% ripple. A 1 in. diameter quartz tube with two essentially straight, parallel sections connected by two approximately 39° bends is used to connect the microwave cavity region with a reaction chamber. The quartz tube contacts the reaction chamber approximately 6 in. beyond the bend in the tube. The inlet to the reaction chamber is surrounded by a baffle box, interior to the reaction chamber. The baffle box walls are made of anodized aluminum and are mounted to the top of the reaction chamber extending approximately 2 in. into the reaction chamber. The plasma discharge products are confined in the baffle box with the only exit being through the bottom of the box. The bottom comprises quartz slides with variable size outlet holes. The temperature inside the reaction chamber is raised using heat lamps. In this system, the body to be processed is placed on a platform resting on pins connected to a floor having variable openings. A vacuum system is connected to the exit of the reaction chamber.

The process gases used to etch the PC board were introduced into the plasma chamber at the following rates in standard liters per minute (slm): 2 slm CF$_4$ (about 8.5% O$_2$), 2 slm O$_2$, and 0.4 slm N$_2$O. The baffle box was configured to etch the entire 6 in. ×3 in. surface of the PC board. The temperature of the PC board ranged from 90° C. to 140° C. during the removal process. The microwave source provided an output power of 500W. The pressure measured near the exit of the reaction chamber was around 3 torr. Under these conditions, the 25.4 μm layer of parylene was removed in about forty minutes.

EXAMPLE 2

A layer of parylene, 1 mil (25.4 μm) thick, was removed from a 4 in. silicon wafer with the same system as in Example 1 except that the baffle box was replaced by a containment sleeve. The containment sleeve is a 2" long 5" diameter tubing made of anodized aluminum.

The gas flow and pressure were the same as in Example 1. The wafer was maintained at a temperature of 110° C. The microwave source provided an output power of 300W. The 25.4μ parylene layer was removed from the silicon wafer in three minutes.

EXAMPLE 3

With the etching system, gas flow, microwave power, and pressure being the same as in Example 1, a layer of parylene, 0.75 mil (19 μm) thick, was removed, in approximately twenty minutes, from a 6 in. ×1 in. ceramic board containing a hybrid integrated circuit (HIC). The temperature of the ceramic board ranged from 90° C. to 130° C. during the removal process.

We claim:

1. Method of fabricating or modifying an article, the article comprising a body comprising, at least some time during the fabrication or modification, a polymer layer, the method comprising:
   (a) removing at least a portion of the polymer layer from the body by a process that comprises:
     (i) causing a flow of gas into a plasma chamber, the gas flow comprising oxygen and optionally comprising one or more additives chosen from the group consisting of N$_2$O, He, Ne, Ar, Kr, and Xe, where, during at least a portion of the process, the volume percentage of the total additives to the total gas flow is in the range 0% to 60%;
     (ii) generating a plasma in the plasma chamber, thereby producing plasma discharge products;
     (iii) causing at least a portion of the plasma discharge products to enter a reaction chamber through an inlet, the body located in the reaction chamber such that the plasma discharge products contact the body, reacting with at least a portion of the polymer layer, and forming an exhaust gas comprising reaction by-products and unreacted plasma discharge products; and
     (iv) causing the exhaust gas to exit the reaction chamber; and
   (b) completing fabricating or modifying the article; characterized in that
   (c) the polymer is a member of the group consisting of poly-para-xylylene, its derivatives, and co-polymers,
   (d) the flow of gas further comprises at least one second gas selected from the group consisting of fluorocarbons of general formula C$_x$F$_y$, with x and y being integers, $1 \leq x \leq 4$ and $1 \leq y \leq 12$; fluorosulfides of general formula S$_r$F$_t$, with r and t being integers, $1 \leq r \leq 3$ and $1 \leq t \leq 16$; and chlorofluorocarbons of general formula C$_u$F$_v$Cl$_w$, with u, v, and w being integers, $1 \leq u \leq 2$ and $1 \leq v \leq 2$, and $1 \leq w \leq 2$, wherein the integers are chosen such that each second gas is a stoichiometric gas at room temperature;
   (e) the plasma is a microwave plasma; and
   (f) the plasma chamber is separate from the reaction chamber, and is connected to the reaction chamber by tubular means.

2. Method of claim 1, wherein completing fabricating or modifying the article comprises one or more applications of step (a).

3. Method of claim 1, wherein the flow of gas is adjusted such that the gas pressure in the reaction chamber is between 0.5 torr and 10 torr.

4. Method of claim 1, wherein the tubular means are arranged such that there is no line-of-sight connection between the plasma in the plasma chamber and the reaction chamber.

5. Method of claim 1, wherein the body is maintained, during at least a portion of step (a), in the temperature range between room temperature and 140° C.

6. Method of claim 1, further comprising providing masking means selected such that plasma discharge products preferentially contact preselected regions of the polymer layer, whereby the polymer layer is selectively etched.

7. Method of claim 1, comprising generating the plasma by a microwave source comprising a power supply that is a full wave rectified switching DC power supply with less than about 1% ripple in the power output.

8. Method of claim 1, wherein the polymer is poly-monochloro-para-xylylene.

9. The method of claim 6, wherein the masking means comprises a baffle box comprising a bottom with one or more variable apertures therein, the location of the apertures corresponding to that of the preselected regions, the baffle box situated between the inlet to the reaction chamber and the body, with the bottom of the baffle box adjacent to the body.

10. Method of claim 9, wherein at least a portion of the exhaust gas is caused to exit the reaction chamber through a floor, the floor comprising a front and back surface essentially parallel to each other, and patterned with holes providing openings from front to back.

11. Method of claim 9, wherein the bottom is a quartz bottom.

12. Method of claim 9, wherein the bottom is a quartz bottom, covered with a layer of material selected from the group consisting of tetrafluoroethylene fluorocarbon polymers, fluorinated ethylene-propylene resins, and their copolymers.

13. Method of claim 1 wherein the gas flow consists essentially of $CF_4$ and oxygen.

14. Method of claim 1 wherein the gas flow consists essentially of $SF_6$, oxygen, and $N_2O$.

15. Method of claim 1 wherein the body has a front surface and a back surface with the back and front surfaces essentially parallel to each other, and the exhaust gas is caused to exit the reaction chamber through an exit located adjacent to the back of the body.

16. Method of claim 1, wherein the body is a printed circuit board with at least one electronic device mounted thereon.

17. Method of claim 6, wherein the article comprises a semiconductor device.

18. Method of claim 6, wherein the article comprises an integrated circuit.

19. Method of claim 1, further comprising changing the gas flow, at a selected time after the gas flow begins, to a gas flow comprising $N_2O$ and $O_2$.

* * * * *